US012796478B2

(12) United States Patent
Dayringer et al.

(10) Patent No.: US 12,796,478 B2
(45) Date of Patent: Nov. 10, 2026

(54) DISTRIBUTING ON CHIP INDUCTORS FOR MONOLITHIC VOLTAGE REGULATION

(71) Applicant: Oracle International Corporation, Redwood City, CA (US)

(72) Inventors: Michael Henry Soltau Dayringer, Belmont, CA (US); Anatoly Yakovlev, San Francisco, CA (US); Ji Eun Jang, Foster City, CA (US); Hesam Fathi Moghadam, Sunnyvale, CA (US); David Hopkins, Carson City, NV (US)

(73) Assignee: Oracle International Corporation, Redwood City, CA (US)

( * ) Notice: Subject to any disclaimer, the term of this patent is extended or adjusted under 35 U.S.C. 154(b) by 142 days.

(21) Appl. No.: 18/801,005

(22) Filed: Aug. 12, 2024

(65) Prior Publication Data

US 2024/0404966 A1 Dec. 5, 2024

Related U.S. Application Data

(60) Continuation of application No. 17/306,870, filed on May 3, 2021, now Pat. No. 12,094,841, which is a (Continued)

(51) Int. Cl.

*H10W 44/00* (2026.01)
*G05F 1/46* (2006.01)

(Continued)

(52) U.S. Cl.

CPC .......... *H10W 44/501* (2026.01); *G05F 1/462* (2013.01); *H02M 1/14* (2013.01); *H02M 3/158* (2013.01);

(Continued)

(58) Field of Classification Search

CPC . H10W 44/501; H10W 20/497; H10W 72/20; G05F 1/462; H02M 1/14; H02M 3/158

(Continued)

(56) References Cited

U.S. PATENT DOCUMENTS 6,351,108 B1 * 2/2002 Burstein .............. H02M 3/157 323/283
6,462,525 B1 * 10/2002 Chen .................. H02M 3/1584 323/285

(Continued)

OTHER PUBLICATIONS

Noah Sturcken, et al., "A Switched-Inductor Integrated Voltage Regulator With Nonlinear Feedback and Network-on-Chip Load in 45 nm SOI", IEEE Journal of Solid-State Circuits, vol. 47, No. 8, Aug. 2012, pp. 1935-1945.

(Continued)

*Primary Examiner* — Paul R. Myers

(74) *Attorney, Agent, or Firm* — S. Scott Foster; Kowert, Hood, Munyon, Rankin & Goetzel, P.C.

(57) ABSTRACT

Distributions of on-chip inductors for monolithic voltage regulation are described. On-chip voltage regulation may be provided by integrated voltage regulators (IVRs), such as a buck converter with integrated inductors. On-chip inductors may be placed to ensure optimal voltage regulation for high power density applications. With this technology, integrated circuits may have many independent voltage domains for fine-grained dynamic voltage and frequency scaling that allows for higher overall power efficiency for the system.

20 Claims, 11 Drawing Sheets

Related U.S. Application Data division of application No. 16/159,448, filed on Oct. 12, 2018, now Pat. No. 11,024,589.

(60) Provisional application No. 62/572,334, filed on Oct. 13, 2017.

(51) Int. Cl.

| | |
|---|---|
| ***H02M 1/14*** | (2006.01) |
| ***H02M 3/158*** | (2006.01) |
| ***H10W 20/40*** | (2026.01) |
| ***H10W 72/20*** | (2026.01) |
| *H01F 27/24* | (2006.01) |
| *H02M 1/00* | (2006.01) |

(52) U.S. Cl.
CPC ......... *H10W 20/497* (2026.01); *H10W 72/20* (2026.01); *H01F 27/24* (2013.01); *H02M 1/0048* (2021.05)

(58) Field of Classification Search
USPC .......................................................... 323/247
See application file for complete search history.

(56) References Cited

U.S. PATENT DOCUMENTS

| | | | | |
|---|---|---|---|---|
| 8,836,298 | B1 | 9/2014 | Chen et al. | |
| 9,515,003 | B1 | 12/2016 | Fitzgerald et al. | |
| 9,537,299 | B2 * | 1/2017 | Rozman | H02H 3/025 |
| 10,097,092 | B1 | 10/2018 | Ho et al. | |
| 11,024,589 | B2 | 6/2021 | Dayringer et al. | |
| 12,094,841 | B2 * | 9/2024 | Dayringer | G05F 1/462 |
| 2005/0240891 | A1 | 10/2005 | Just et al. | |
| 2007/0216388 | A1 | 9/2007 | Sohma | |
| 2008/0001698 | A1 | 1/2008 | Hazucha et al. | |
| 2008/0005597 | A1 * | 1/2008 | Kern | G06F 11/24 714/E11.154 |
| 2008/0157742 | A1 | 7/2008 | Martin et al. | |
| 2008/0157743 | A1 | 7/2008 | Martin et al. | |
| 2009/0085536 | A1 * | 4/2009 | Qahouq | H02M 3/1584 323/272 |
| 2009/0134857 | A1 | 5/2009 | Zeng et al. | |
| 2009/0146621 | A1 * | 6/2009 | Tang | H02M 3/1584 323/234 |
| 2010/0033236 | A1 | 2/2010 | Triantafillou et al. | |
| 2011/0131797 | A1 * | 6/2011 | Gardner | H01F 17/0006 29/602.1 |
| 2012/0249101 | A1 | 10/2012 | Akey | |
| 2013/0062730 | A1 * | 3/2013 | Palumbo | H10W 20/497 438/3 |
| 2014/0056041 | A1 * | 2/2014 | Zhu | H02M 3/1584 363/65 |
| 2014/0084414 | A1 * | 3/2014 | Jezewski | H10D 1/20 257/E21.022 |
| 2014/0253279 | A1 * | 9/2014 | Doyle | H01F 17/02 336/84 M |
| 2015/0042400 | A1 * | 2/2015 | Sturcken | G05F 1/465 327/540 |
| 2015/0372597 | A1 | 12/2015 | Luo et al. | |
| 2016/0172310 | A1 * | 6/2016 | Zhai | H10W 42/20 257/659 |
| 2016/0190113 | A1 * | 6/2016 | Sharan | H10P 54/00 257/532 |
| 2016/0233192 | A1 * | 8/2016 | Dosluoglu | H10W 20/43 |
| 2016/0248327 | A1 | 8/2016 | Li | |
| 2017/0060205 | A1 | 3/2017 | Bharath et al. | |
| 2017/0207697 | A1 | 7/2017 | Heo et al. | |
| 2018/0332708 | A1 * | 11/2018 | Lambert | H05K 1/185 |
| 2019/0115308 | A1 | 4/2019 | Dayringer et al. | |
| 2021/0257317 | A1 | 8/2021 | Dayringer et al. | |
| 2022/0094263 | A1 | 3/2022 | Bharath et al. | |

OTHER PUBLICATIONS

Wonyoung Kim, et al., "System Level Analysis of Fast, Per-Core DVFS using On-Chip Switching Regulators", 2008 IEEE 14th International Symposium on High Performance Computer Architecture, pp. 123-134.

Edward A. Burton, et al., "FIVR-Fully Integrated Voltage Regulators on 4th Generation Intel® Core™ SoCs", 2014 IEEE Applied Power Electronics Conference and Exposition (APEC 2014), pp. 432-439.

Noah Sturcken, et al., "Magnetic Thin-Film Inductors for Monolithic Integration with CMOS", 2015 IEEE International Electron Devices Meeting (IEDM), 2015, p. 11.4.1-11.4.4.

Avinash Sodani, et al., "Knight Landing: Second-Generation Intel Xeon Phi Product", Published by the IEEE Computer Society, vol. 36, No. 2, Mar.-Apr. 2016, pp. 34-46.

Yuri Panov, et al., "Design Considerations for 12-V/1.5-V, 50-A Voltage Regulator Modules", IEEE Transactions on Power Electronics, vol. 16, No. 6, Nov. 2001, pp. 776-783.

Hongyu Chen, et al., "Optimal Planning for Mesh-Based Power Distribution", ASP-DAC 2004: Asia and South Pacific Design Automation Conference, 2004, pp. 444-449.

Angel V. Peterchev, et al., "Architecture and IC Implementation of a Digital VRM Controller", IEEE Transactions on Power Electronics, vol. 18, No. 1, Jan. 2003, pp. 356-364.

J. Ted DeBene II Ph. D, et al., "A 400 Amp fully Integrated Silicon Voltage Regulator with in-die magnetically coupled embedded intductors", in Advanced Power Electronics Conference, 2010, pp. 1-25.

Noah Sturcken, PhD, "DC-DC Power Conversion with CMOS Integrated Thin-Film Inductors," Proceedings 5th International Workshop on Power Supply On Chip (PwrSoC2016), Oct. 3-5, 2016, pp. 1-24.

* cited by examiner

DISTRIBUTING ON CHIP INDUCTORS FOR MONOLITHIC VOLTAGE REGULATION

RELATED APPLICATIONS

This application is a continuation of U.S. patent application Ser. No. 17/306,870, filed May 3, 2021, which is a divisional of U.S. patent application Ser. No. 16/159,448, filed Oct. 12, 2018, now U.S. Pat. No. 11,024,589, which claims benefit of priority to U.S. Provisional Application Ser. No. 62/572,334, filed Oct. 13, 2017, and which are incorporated herein by reference in their entirety.

BACKGROUND

Field of the Disclosure

This disclosure relates generally to electronic systems, and more particularly, power distribution in electronic systems.

Description of the Related Art

The increasing ability to integrate more circuits on an integrated circuit (IC) die has resulted in much greater processing power for devices such as microprocessors, digital signal processors, and other types of integrated circuits. The greater processing power requires, in turn, higher pin counts and greater power requirements. Since there is a trend towards lower voltages, the increased processing power results in higher current requirements. The off-chip nature of voltage regulator modules (VRMs) gives rise to many undesirable effects that decrease the total efficiency of power conversion and delivery. Located on the motherboard at a distance from the chips they power, VRMs are often found to be too slow, too coarse, and too inefficient in many recent applications.

SUMMARY

Various embodiments of distributing on-chip inductors for monolithic voltage regulation are described. An integrated voltage regulators (IVR) may be implemented using inductors (among other components) that may be grouped on a die of an integrated circuit in physical pairs. Each inductor in a pair may be assigned a different clock phase with respect to the other inductor in the pair from an even number of possible clock phases, in some embodiments. In some embodiments, the output port of an inductor in a pair may be located on sides that face or are otherwise closest to the output port of the other inductor in the pair.

In various embodiments, inductors may be grouped on a die according to voltage domains and/or according to various areas of interest. In some embodiments, the number of inductors distributed across the voltage domains may be evenly distributed or different numbers of inductors may be placed in different voltage domains.

Figure 1A:
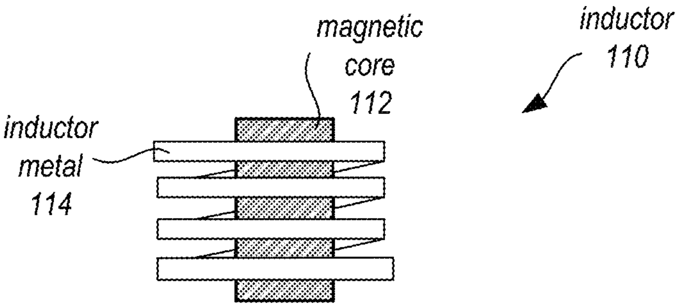
FIG. 1A illustrates an on-die integrated voltage regulator (IVR) with an inductor with a magnetic core, according to some embodiments.

While the disclosure is described herein by way of example for several embodiments and illustrative drawings, those skilled in the art will recognize that the disclosure is not limited to embodiments or drawings described. It should be understood that the drawings and detailed description hereto are not intended to limit the disclosure to the particular form disclosed, but on the contrary, the disclosure is to cover all modifications, equivalents and alternatives falling within the spirit and scope as defined by the appended claims. Any headings used herein are for organizational purposes only and are not meant to limit the scope of the description or the claims. As used herein, the word "may" is used in a permissive sense (i.e., meaning having the potential to) rather than the mandatory sense (i.e. meaning must). Similarly, the words "include", "including", and "includes" mean including, but not limited to.

DETAILED DESCRIPTION OF EMBODIMENTS

Various embodiments of distributing on-chip inductors for monolithic voltage regulation are described herein. Voltage regulation for high power integrated circuits, or chips, is typically done on the PCB nearby to the chip. Utilizing voltage regulation on the PCB, however, may require getting a very high current density through the package, resulting in significant power loss. Additionally, in order to provide more granular control features of voltage regulation, such as splitting the chip into multiple voltage domains, to achieve power efficiency could require more packaging resources (e.g., to implement separate voltage regulators on the PCB for different voltage domains). Instead, techniques for implementing monolithic integrated voltage regulators (MIVRs) on an integrated circuit, according to the various embodiments described below, can allow for higher voltages, and thus lower currents, outside the integrated circuit.

Some existing techniques attempt to circumvent the problems associated off-chip voltage regulation by placing a single inductor on the chip (or small number of inductors in the chip). However, placement of a single inductor (or small number of inductors on the chip) may not provide an optimal solution to overcome the negative effects from physical power distribution on-chip. For example, a large inductor (or small group of inductors) placed in a single location could reduce the dynamic effects of power distribution by minimizing voltage ripple, but would be unable to ameliorate the negative static effects of such a placement, like direct current voltage drop (DC IR drop). Integrated circuits that distribute inductors to provide monolithic voltage regulation according to the techniques discussed below can improve power distribution performance by optimally accounting for both dynamic and static negative effects of on-chip placement of inductors.

In various embodiments, integrated voltage regulators implemented as inductors may be grouped on a die of an integrated circuit in physical pairs. Each inductor in a pair may be assigned a different clock phase with respect to the other inductor in the pair from an even number of possible clock phases, in some embodiments. In at least some embodiments, the assigned clock phase for each inductor in the pair may be the opposite clock phase (e.g., 1800 out of phase with the paired clock phase), as discussed below with regard to FIGS. 6A-6D. In this way, the differently assigned clock phases within a pair may create a voltage ripple cancellation effect. In some embodiments, as discussed below with regard to FIG. 6A, the output port of inductors in a pair may be located on sides that face or are otherwise closest to the output port of the other inductor in the pair in order to minimize the distance between the outputs of the two inductors. In this way, the impedance between the inductors in the pair may be minimized, further contributing to the minimization of voltage ripple, in some embodiments.

In various embodiments, integrated voltage regulators using inductors may be grouped on a die according to voltage domains (e.g., specific to a component, such as a processor core) and/or according to various areas of interest. In some embodiments, the number of inductors distributed across the voltage domains may be evenly distributed (e.g., 4 domains and 64 inductors may result in a placement of 16 inductors per domain) in scenarios where power consumption across the voltage domains or area of interests is even. In other embodiments, different numbers of inductors may be placed in different voltage domains (e.g., more inductors in an area with higher power consumption than other areas). Utilizing the above techniques may allow for an average impedance for IVRs to be maintained.

In various embodiments, interleaving clock phases may be assigned across pairs, as discussed below with regard to FIGS. 6A-6D in order to preserve both the voltage ripple minimization and voltage drop minimization when enabling or disabling different inductors. Distributing multiple inductors may also allow for fine-grained control for both phase shedding or other dynamic power scaling techniques as well as enabling or disabling inductors for various components or features of the integrated circuit (e.g., enabling or disabling inductors for individual processor cores).

Moreover, in various embodiments, the techniques described above may allow for various design constraints, such as routing space, current sharing, magnetic field coupling, and interference with the floorplan to be balanced in order to maximize the overall efficiency of the power delivery network (PDN) for the integrated circuit. Thus, the techniques may be highly applicable in various scenarios in order to provide on-chip voltage regulation for high power chips, such as processors (e.g., multicore processors, central processing units (CPUs), graphics processing units (GPUs), and so on).

In various embodiments, IVRs may be located within the same die as their loads. Taking advantage of their proximity to the load, IVRs may reduce Ldi/dt, as a result of higher input voltage to the IVR, and higher control loop bandwidth, decreasing droop and overshoot of the output voltage. Faster transient response may also lower dynamic voltage scaling (DVS) turn-around time, allowing IVRs to effectively follow the workload and further improve the integrated circuit's power efficiency. Resistive loss along the power path between IVR and load—including board, package, and guard band circuits—may be reduced as the IVR is moved into the die. Lastly, IVRs improve the overall efficiency of power delivery by enabling multiple voltage domain division of the chip's multiple cores, even in the case where board or package resources are limited.

Figure 1B:
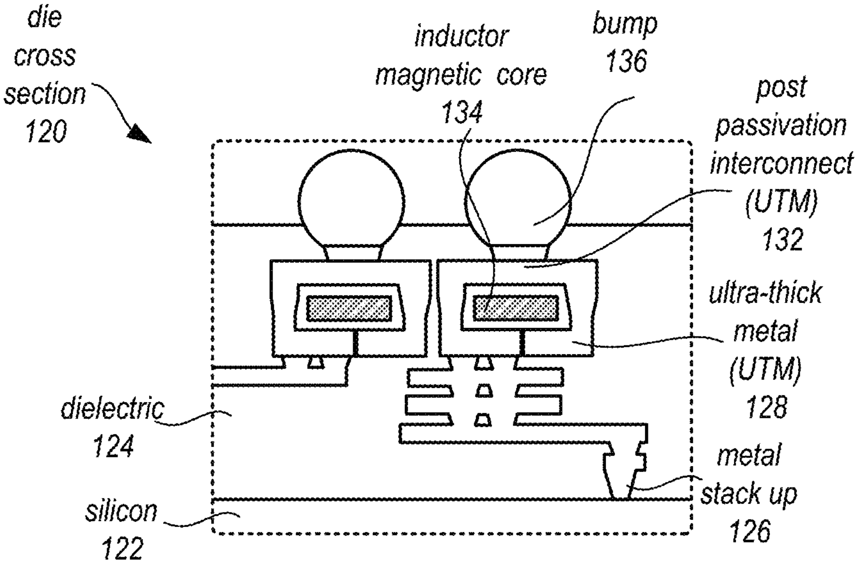
FIG. 1B illustrates a cross-sectional view of a die showing embedded inductors for an IVR, according to some embodiments.

Three types of IVRs are commonly used in practice: buck converter (BC), which may use inductors, switched capacitor (SC), which may use capacitors, and low drop-out (LDO) regulator which does not use large passives. In various embodiments, an IVR may be implemented as a buck converter on-die that uses magnetic core inductors, as illustrated in FIGS. 1A and 1B. FIG. 1A illustrates an on-die inductor with a magnetic core, according to some embodiments. Magnetic core 112 may be surrounded by inductor metal 114 in order to generate a magnetic field to store energy received via an input port in order to support a desired output voltage, in some embodiments.

FIG. 1B illustrates a cross-sectional view of a die showing embedded inductors implemented as part of an IVR, according to some embodiments. Die cross section 120 depicts inductors, which may include a magnetic core 134 and surrounding ultra-thick metal (UTM). Post passivation interconnect (PPI) layers may be implemented around magnetic core 134 and bumps 136. Metal stackup 126 for an IVR may be implemented within dielectric 124 and connected to silicon 122.

Figure 1C:
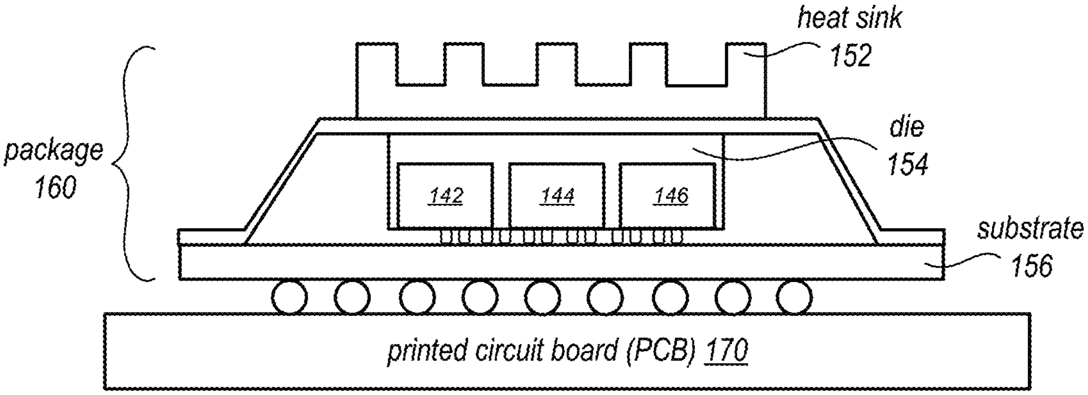
FIG. 1C illustrates an example package with an IVR using inductors, according to some embodiments.

FIG. 1C illustrates an example integrated circuit with on-die inductors of an IVR, according to some embodiments. For instance, printed circuit board (PCB) 170 may have package 160 mounted on a surface of PCB 170. Integrated circuit 170 may include a heat sink 152, die 154 and substrate 156. Various components and features that cause the load may be implemented on die 154 (e.g., processor cores for a multiprocessor), as well as multiple inductors, such as inductors 142, 144, and 146. Package 160 and printed circuit board 170 may be implemented as part of an electronic assembly in various systems, such as computer system 1100 in FIG. 9 and discussed below, in various embodiments.

Techniques for placing pairs of inductors on a die of an integrated circuit to implement an IVR may be performed in view of various design considerations. For example, in some embodiments, the design of an IVR itself may need to meet certain criteria for it to be integrated into an integrated circuit (e.g., processor) that is already at its thermal-electrical limits. Any decrease in power conversion efficiency could, for instance, result in significantly more power usage for a large data center. Therefore, IVRs for a high power integrated circuit (e.g., a high power processor) should be placed with efficiency at peak load in view, which is when the integrated circuit is at its thermal limit. Moreover, the power density of the integrated circuit can increase by 10-20% due to IVR inefficiencies making cooling a further consideration, in some embodiments.

The current density the IVR is capable of supporting is also a design consideration, in some embodiments. Modern server-class processors, for example, can consume >200 W and average core current density can be on the order of 1-2

A/mm$^2$. Additionally, output ripple may be typically constrained to <1% of the supply to minimize noise and voltage margin overhead.

Due to the nature of varying workloads, load requirements of some integrated circuits like processors can change rapidly in a short amount of time, in some embodiments. Such changes may cause voltage droop and overshoot that have to be filtered by IVRs. Supply voltage droops can increase the potential for timing violations. Overshoots can increase the risk of transistor break down and reliability issues. However, in various embodiments locating the IVR on the die close to the load can provide a faster transient response in order to mitigate these concerns.

Die area may be considered when selecting IVRs, in some embodiments. For example, on-chip inductors in BC IVRs may be very wide and consume a lot of valuable die area. Furthermore, on-die decoupling capacitors may be placed around the gates of BC IVRs in order to charge/discharge them effectively. In some embodiments, a die area consumption limit for IVRs (e.g., <5% of total die area) may be enforced.

For IVRs implemented with inductors, power loss can be another design consideration. Inductor DC conduction loss for IVRs can be addressed by parallelizing multiple inductors at the cost of decreasing effective inductance, in some embodiments. While parallelizing multiple inductors can increase total inductor current ripple and AC conduction loss, increasing switching frequency may be implemented, as it decreases inductor current ripple.

In some scenarios, inductor resistance can grow rapidly at high frequencies and overwhelms the benefit of smaller current ripple. For instance, if the nominal operating duty cycle is around 0.5, then inductor AC conduction loss can be further improved, in various embodiments by placing inductors in pairs, as discussed above, with different (e.g., opposite phases) driving the coupled inductors pair.

In some embodiments, a stacked-switch topology can decrease driver conduction loss. In this way, the driver stage can be made of thin-oxide devices, which can decrease switch resistance by a factor of 5-10 compared to thick-oxide devices occupying the same area. For instance, in a 28 nm process, a 0.85V thin oxide device has ~5× less resistance than a 1.5V thick oxide device with the same channel width. Stacked topology may utilize additional mid-rail bias voltage generators. However, if such additional mid-rail bias voltage generators are used, a charge-sharing technique can be applied, in some embodiments.

Figure 2A:
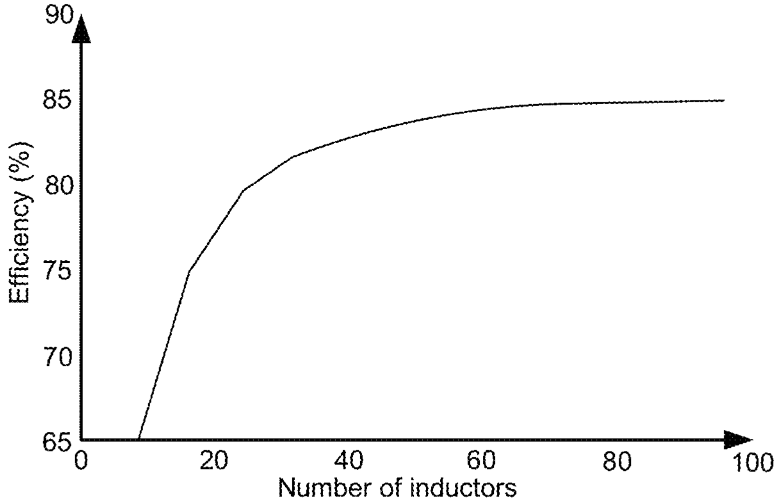
FIG. 2A is a graph illustrating estimated power conversion efficiencies with different numbers of inductors, according to some embodiments.

FIG. 2A is a graph illustrating estimated power conversion efficiencies with different numbers of inductors, according to some embodiments, may be utilized to determine an optimal number of inductors to place in an integrated circuit. In the illustrated analysis, each design point (e.g., 0 to 100 inductors) may be optimized for best efficiency with 1.6V input, 1V output, and 50 A load current under a switch and gate decoupling area limitation of 5% of total die area, for example. As illustrated in FIG. 2A, maximum efficiency could be determined, which in the illustrated analysis saturates beyond the use of 80 inductors. Due to total chip area limitation (discussed above), 64 inductors may be chosen given the above analysis. Note that other analysis for other power conversion efficiencies may reflect a different number of inductors as optimal for an integrated circuit, and thus the previous example is not intended to be limiting.

Figure 2B:
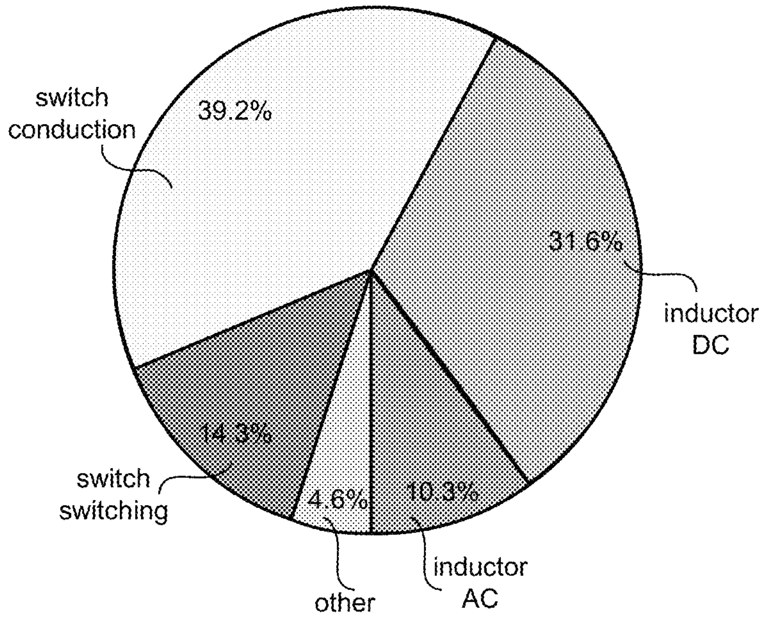
FIG. 2B is a chart illustrating loss sources, according to some embodiments.

FIG. 2B is a chart illustrating loss sources, according to some embodiments. FIG. 2B illustrates the major sources of inefficiency, including the inductor AC and DC losses, switch (also known as driver) switching and conduction losses, as well as other losses, which includes controller and dead-time conduction losses. It should be noted that parasitic inductance coupling (PIC) is not considered in this example analysis.

Another consideration when placing inductors examines lateral power distribution. While current placement techniques may restrict just power and ground bumps in chip core areas to alleviate routing issues, various embodiments may allow for placement where current for the core area is supplied from the on-die inductors, so the inductors are spread out evenly to ensure good lateral distribution.

As noted above, size of inductors may be considered when designing a MIVR. For instance, small inductors may carry large area overheads due to routing keep out zones surrounding the inductor, whereas large inductors may stress the lateral routing and can have large dead-zones for power delivery beneath them due to the thick metal layers being used to construct the inductor. Additionally, inductors may not have live electrical bumps above them, so choosing a size that works with the desired bump pitch is important for efficient use of metal resources. In at least some embodiments, an inductor that fits within a two-by-two array of missing bumps was selected. Other inductor sizes may be used in other embodiments.

Figure 3A:
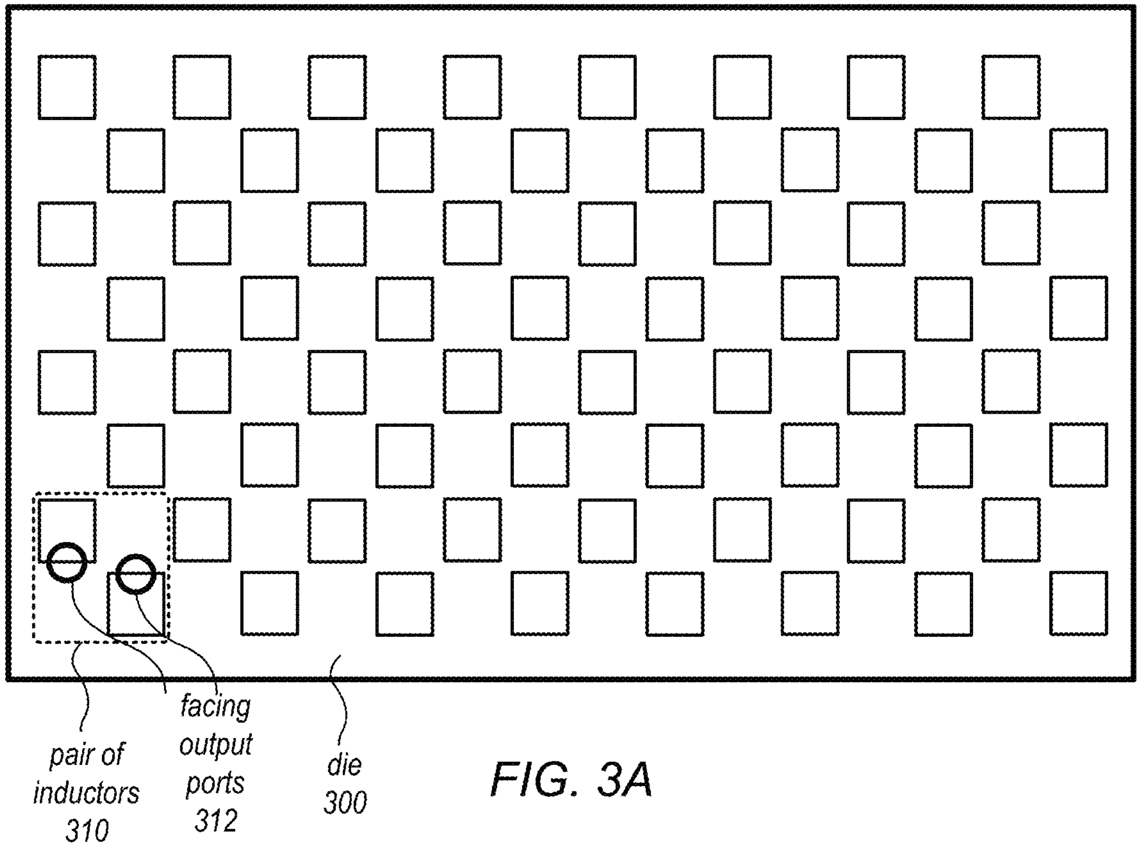
FIGS. 3A-3C illustrates an example die floorplan, according to some embodiments.

As noted above, placement of the output port of the inductor can affect output ripple due to the interaction between output currents from different inductors. Pairs of inductors were oriented opposite to each other so that their output ports were as close together as possible. By assigning each inductor in each pair a different (e.g., opposite) clock phase, optimal ripple cancellation at the output nodes may be ensured, as discussed below with regard to FIGS. 6A-6D. For example, in FIG. 3A, an example floor plan of die 300 illustrates various inductors. One pair of inductors 310 is identified. As noted in the illustration, facing output ports 312 may be implemented. A similar orientation of output ports for other illustrated pairs (not indicated) may be implemented (e.g., the pair above and the pair to the side of pair 310).

Figure 3B:
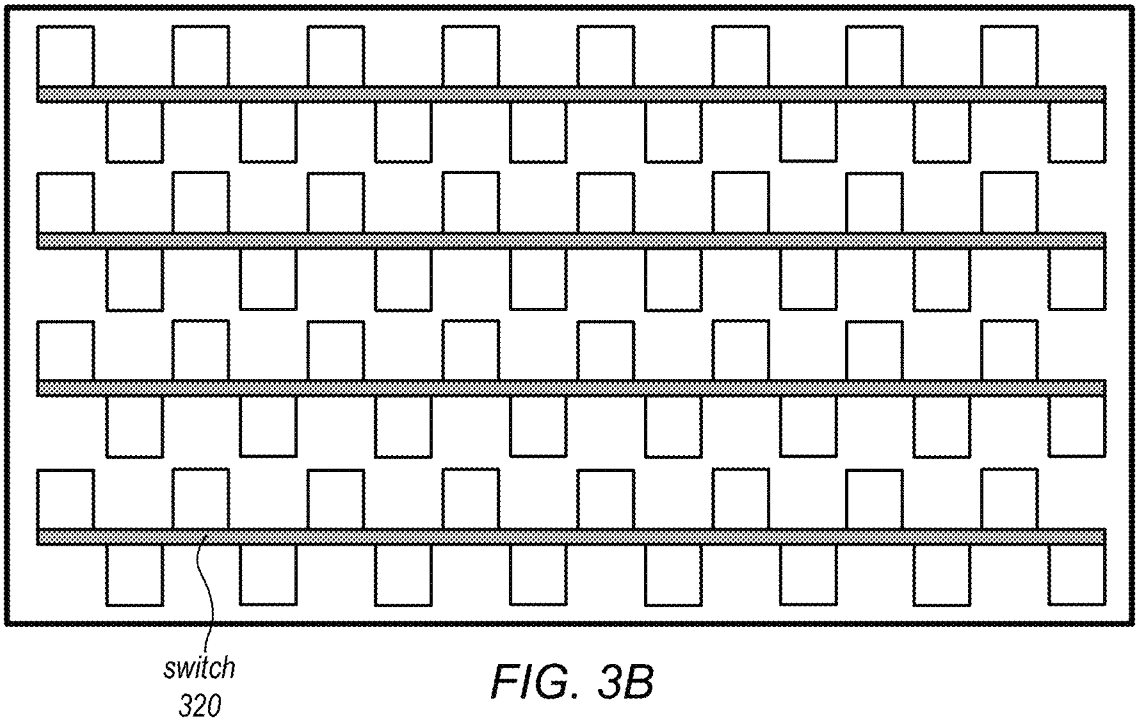
Figure 3C:
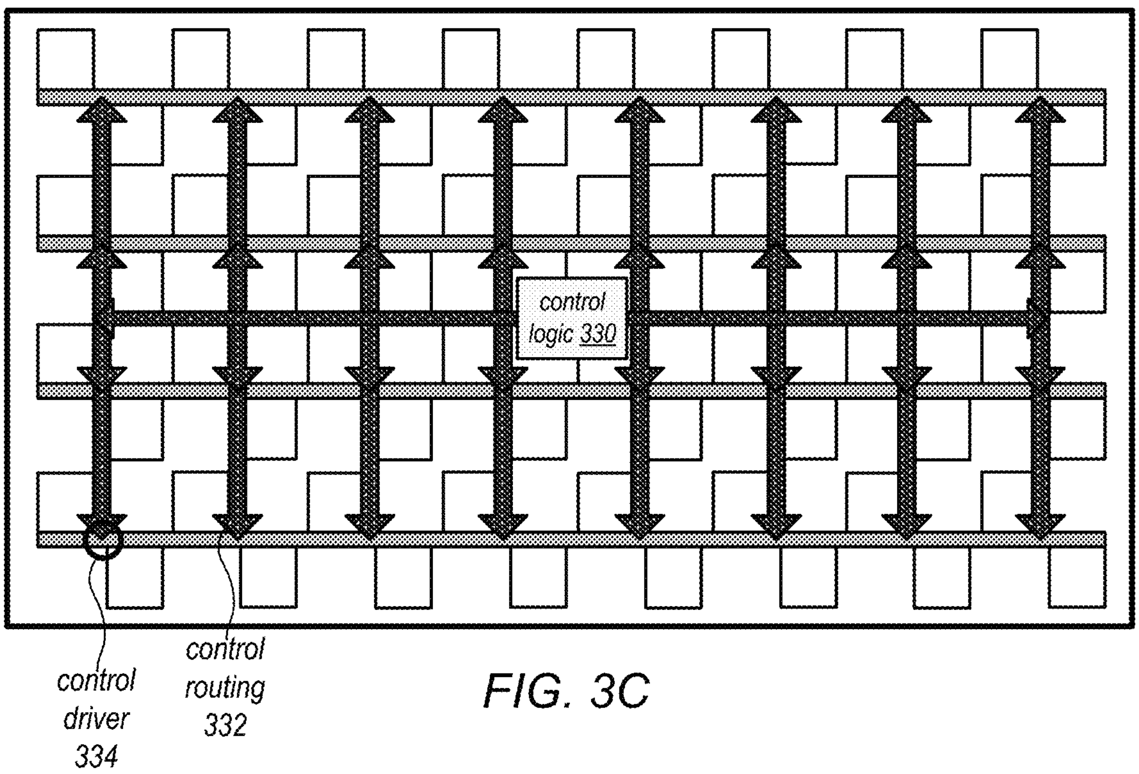

FIGS. 3B and 3C may illustrate an example floorplan for the locations of the power switches and control logic, in some embodiments. Switch and control route placement can directly impact overall efficiency, in various embodiments. For example, by consolidating all the control logic and drivers for the inductors of the IVR, control skew to the switches may be reduced. Additionally, design of a power macro may be simplified by placing the control logic into a single, contiguous piece.

Consolidation, however, can increase power losses due to routing from the switches to the inductors and the increased sensing errors and delays in feedback to the control logic, which would reduce the efficiency of the overall power delivery system. Placement techniques that consolidate control while distributing drivers to enable or disable inductors to be as close to the inductors may provide an optimal balance between these concerns.

In FIG. 3B, switches may run between each pair of inductors. In FIG. 3C, a control driver may be placed centrally between each inductors pair, like control driver 334. Control logic, like control logic 330, may be centralized for the whole integrated circuit and control routing 332 of control signals may be distributed to the center of each column of inductors and then further distributed within each column to the drivers, in some embodiments. In other embodiments, such as embodiments where inductors are not evenly distributed (not illustrated) or different voltage domains or other areas of interest may provide for different control routing to different inductors, control logic 330 may not be centered, or may be distributed (e.g., control logic for separate voltage domains).

Figure 4:
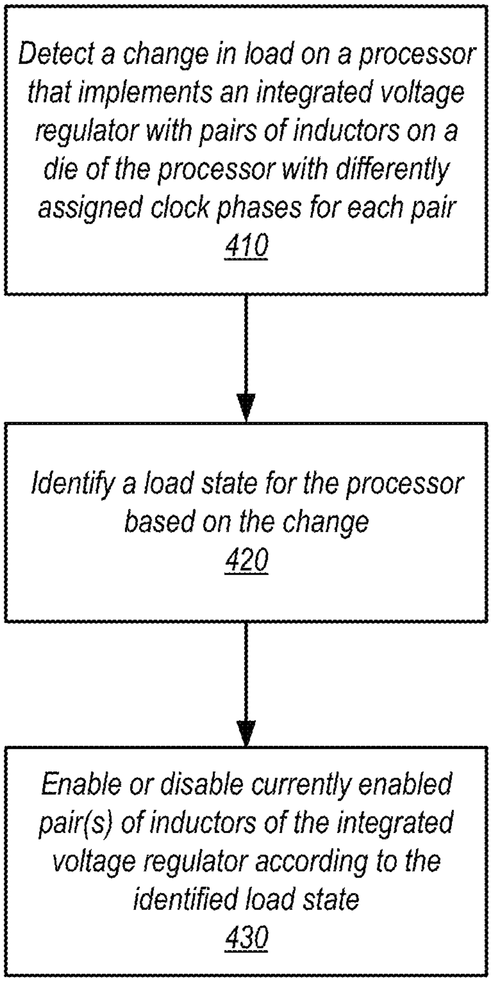
FIG. 4 is a high-level flowchart illustrating a method and technique for managing pairs of inductors according to an identified load state for a processor, according to some embodiments.

Control logic 330 may be implemented in different ways according to the supported clock phases, voltage domains, and/or other areas of interest. FIG. 4 is a high-level flowchart illustrating a method and technique for managing pairs of inductors according to an identified load state for a processor, according to some embodiments. As indicated at 410, a controller that implements control logic 330 (or another type of controller for IVRs implemented differently than control logic 330) may detect a change in load on a processor (or other integrated circuit) that implements an integrated voltage regulator with pairs of inductors on a die of the processor with differently assigned clock phases for each pair. For example, a CPU or other component implemented on an integrated circuit may track current or other utilization metric for components on the integrated circuit which may indicate load on the component (e.g., the CPU as a whole or a core of the CPU). In some embodiments, a current detection sensor for one or more integrated circuit components may also indicate a change in load, A change in load may also be detected corresponding to the enablement/disablement of a component (e.g., a core in a multicore processor), in some embodiments (which may be signaled to the controller by the CPU, for instance).

Figure 6A:
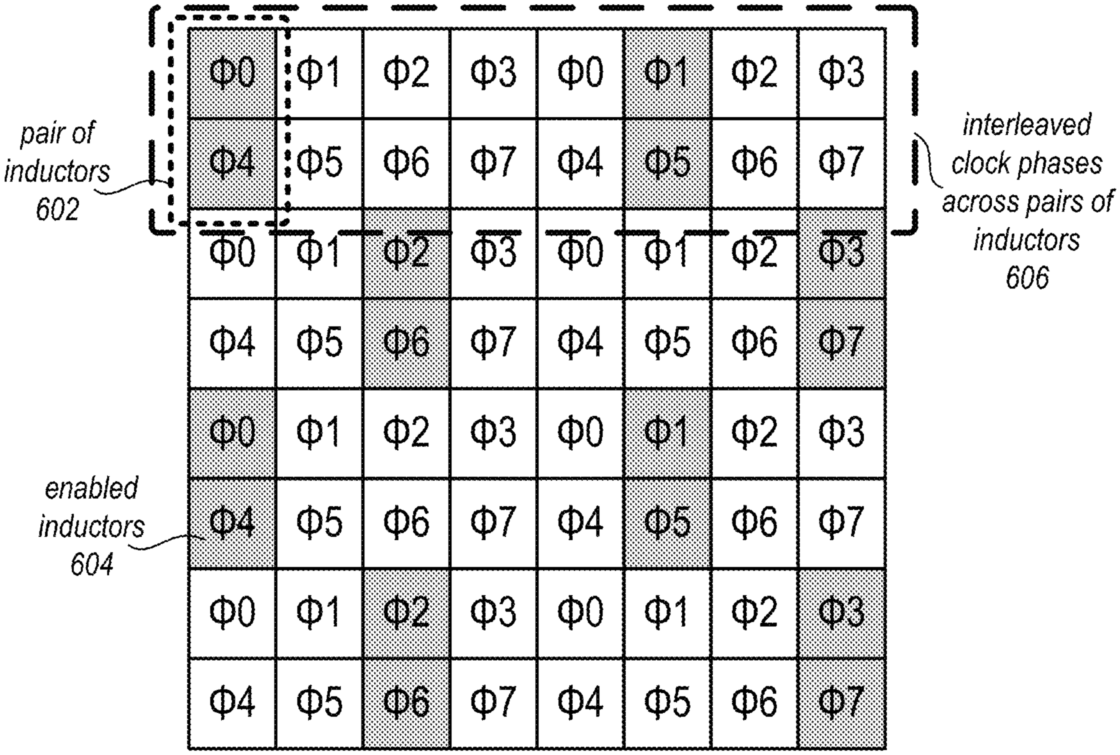
FIGS. 6A-6D illustrate example phase assignments and load states, according to some embodiments.
Figure 6B:
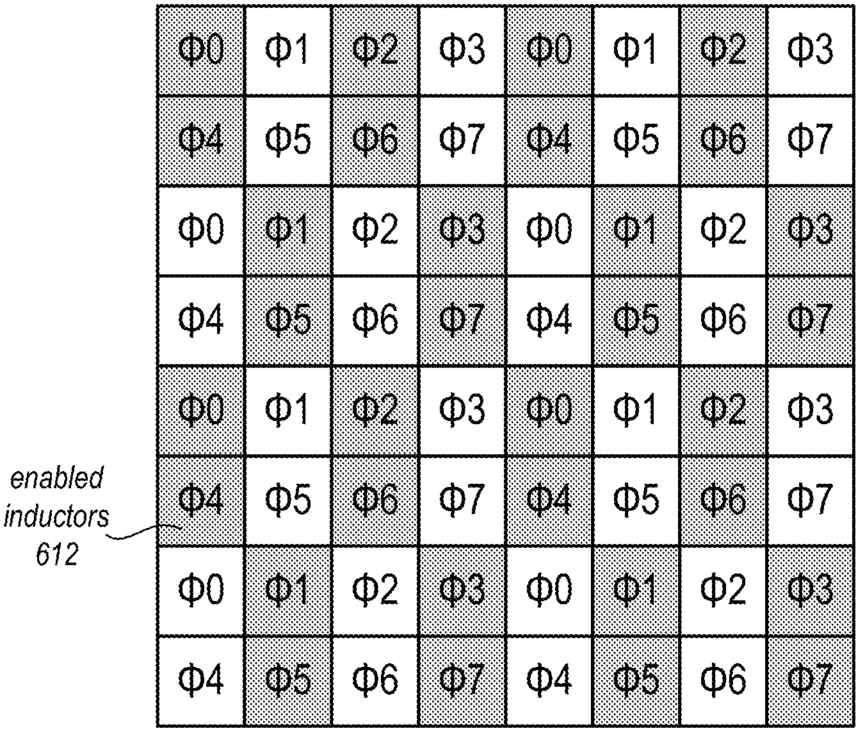
Figure 6C:
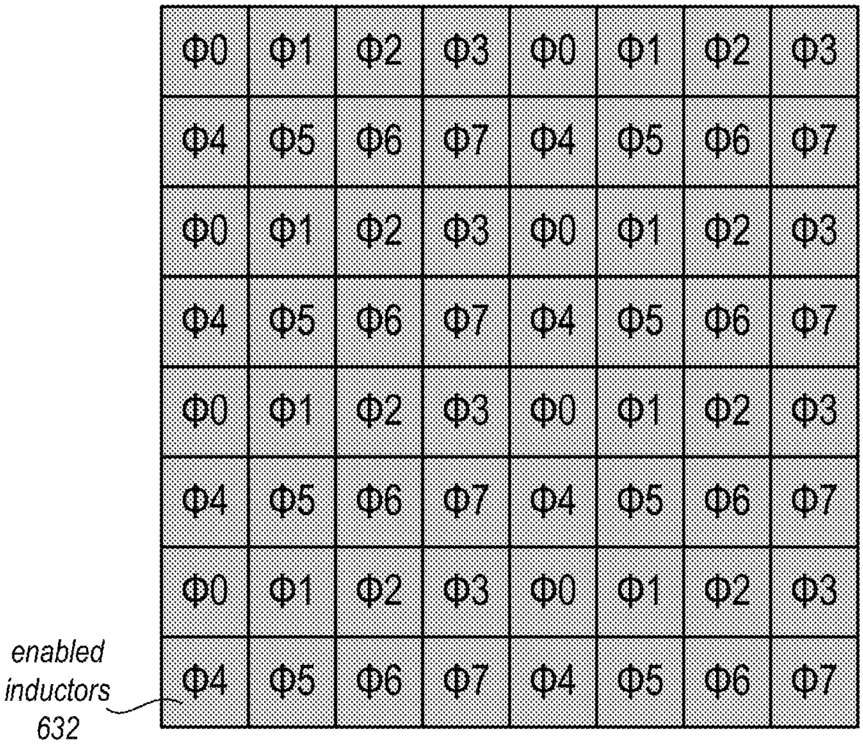
Figure 6D:
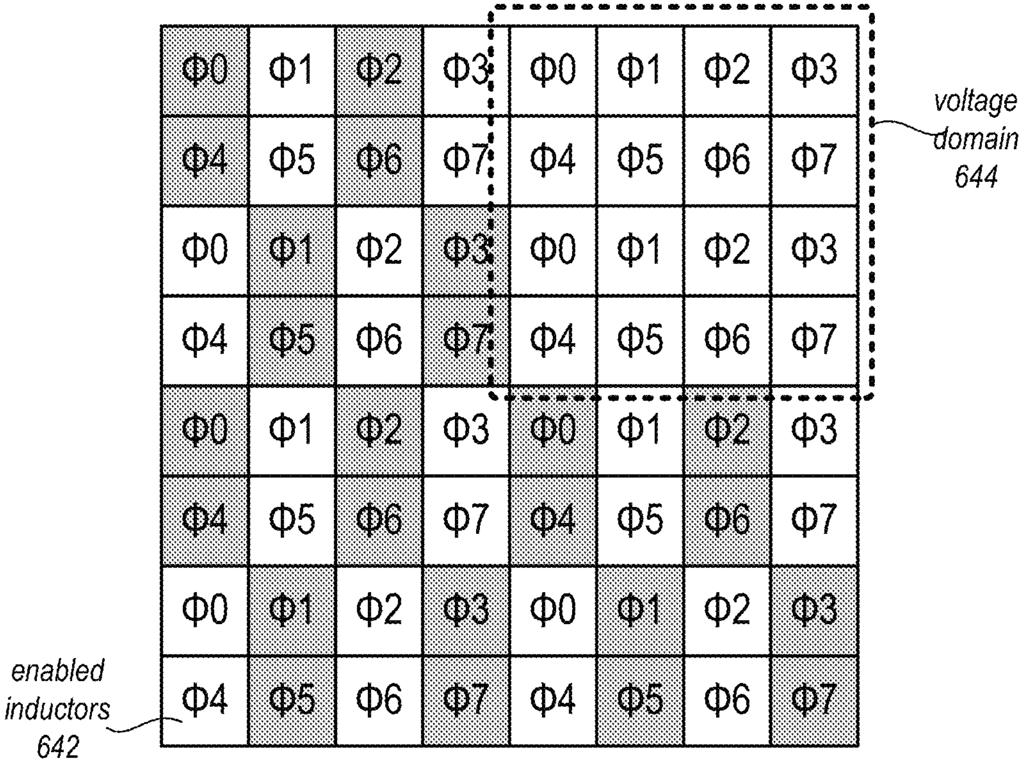
Figure 7:
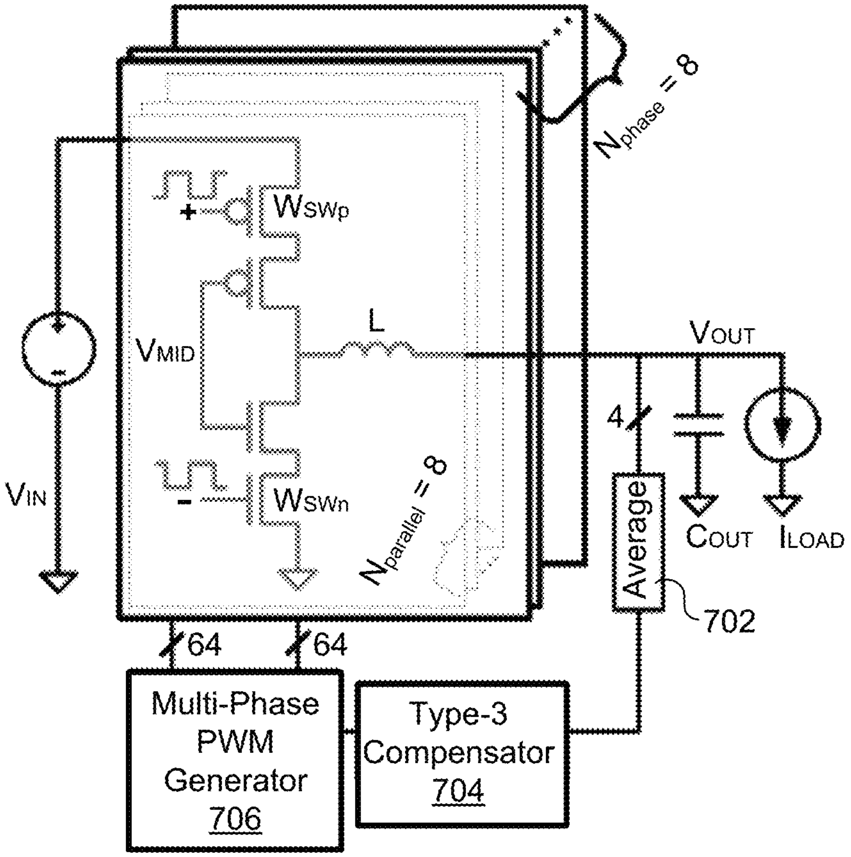
FIG. 7 illustrates an example of a circuit diagram that distributes on-chip inductors for monolithic voltage regulation, according to some embodiments.

As indicated at 420, a load state for the processor may be identified based on the change, in some embodiments. For example, a lookup table that maps the detected change (e.g., change in current, change in utilization, change in enablement of components) to a load state for the processor (e.g., a number of phases enabled as illustrated in FIGS. 6A-7). Once identified, the controller may then enable or disable currently enabled pair(s) of inductors of the integrated voltage regulators according to the increased state (e.g., to provide for phase number increases or shedding as discussed below or to enable/disable voltage domains as discussed below), as indicated at 430.

In some embodiments, a power distribution network (PDN) may be designed to minimize a worst case DC IR drop and voltage ripple. In some embodiments, PDN may include the metal routing for distribution of power supply from an output port of an IVR to load. For example, an integrated circuit may be a multicore processor that utilizes thick top metal layers to distribute power and ground uniformly across the die as the PDN. In such an example, lower metal layers may be significantly more resistive, and may be used for local current distribution and signal routing. In at least some embodiments, on-die inductors may utilize the same top-layer metal resources as the PDN.

As noted above, inductors can vary in size. While larger inductors may have more desirable properties in terms of optimal performance, the total load current density and available metal resources for power distribution under such large size inductors may restrict the areas in which the large-size inductors can be placed. Because effective sheet resistance of metal layers below an inductors can be more than 10× that of thick metal layers, in some instances, voltage drop can be an order of magnitude higher compared to the drop across thick layer distribution over the same area. With uniform load current distribution, the worst case IR drop may be to the load located under the center point of the inductors. Total load current under the inductor may increase linearly with inductor area, proportionally increasing the worst case IR drop. Therefore, doubling the length and width of an inductor can approximately quadruple the IR drop to its center.

Another consideration is that additional penalty from higher IR drop may arise from overvoltage losses resulting from a voltage margin that is provisioned at a worst-case location on the chip (e.g., under the center point of the inductor). The higher the regulated voltage necessary to compensate for the worst case IR drop, the higher the power consumption everywhere else on the chip where voltage exceeds the minimum required, in such a scenario.

In various embodiments, power distribution may be equally important for supply and ground. A design consideration for prioritizing supply distribution over ground distribution, in some embodiments, may be to minimize connection impedance among different IVR phases to ensure high quality current sharing, and thereby minimizing voltage ripple, allowing for a smaller voltage margin and lowering the associated overvoltage losses. Therefore, analysis of metal resource allocation between supply and ground and its effects on supply ripple and power loss may be performed, in order to determine appropriate allocation of routing resources in some embodiments.

Figure 5:
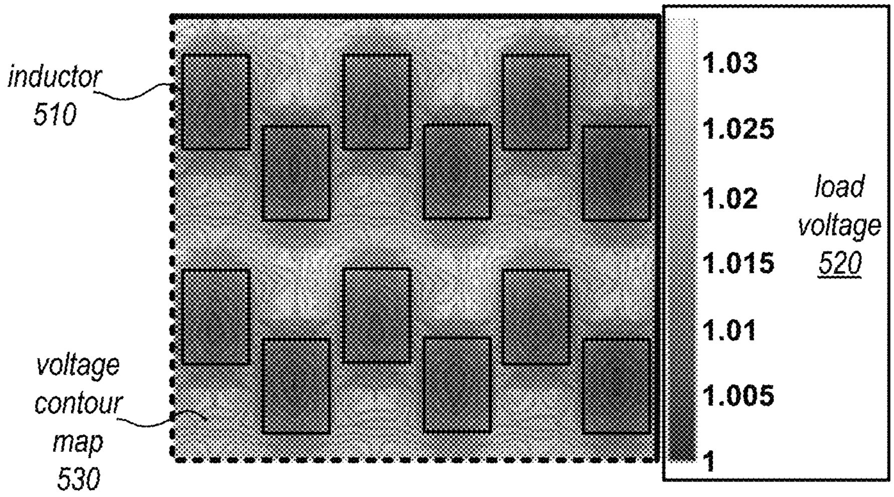
FIG. 5 is a contour plot of load voltage across different pairs of inductors, according to some embodiments.

In order to rapidly verify and optimize clock phase distribution, inductor geometry choice, and PDN routing, a PDN modeling tool may be used. FIG. 5 is a contour plot of load voltage across different pairs of inductors, according to some embodiments. Contours in voltage contour map 530 may show normalized transient simulation contour plots of IR drop and ripple across multiple inductors, like inductor 510. As indicated in load voltage scale 520, the example plot may be normalized to set a minimum voltage of 1V. Maxima may occur at the output of every IVR with approximate overvoltage of 3.5% for the illustrated example.

In various embodiments, an integrated circuit (e.g., a microprocessor) may implement dynamic voltage and frequency scaling (DVFS) for power savings. To maximize efficiency across a range of output loads, inductor shedding may be performed. FIG. 6A illustrates example phase assignments and load states, according to some embodiments. In FIG. 6A, an example number of phases, Φ0-Φ7 (8 phases in total), are distributed across the integrated circuit area. As discussed above a pair of inductors, like pair 602, may be assigned different clock phases (e.g., Φ0 and Φ4).

Also as discussed above, assigned clock phases may be interleaved, and thus different across pairs in order to further distribute increases or decreases in load state by enabled inductor pairs across the integrated circuit. For example, interleaved clock phases 606 show that neighboring inductor pairs may not be adjacent to the same clock phase (e.g., Φ0 is adjacent to Φ1 or Φ3, and so on).

In some embodiments, a traditional phase shedding approach may be implemented. For example, a load state may be mapped to an enabled state for inductors in order to remove all inductors of each shed phase, (e.g., dropping all Φ4-Φ7 to go from full load to half load state). In another embodiment, different load states may be mapped to keeping different numbers of inductors with an assigned clock phase enabled, so that disabling or enabling may include some inductors from each assigned clock phase. For example, in FIG. 6A shaded inductors 604 indicated enabled inductors for an example "quarter load" state so that only 2 inductors are enabled for each clock phase. FIG. 6B may illustrate a "half load" state where 4 of the 8 inductors assigned each clock phase are enabled, as indicated at 612. FIG. 6C may illustrate a full load state where all inductors are enabled, as indicated at 632.

As discussed above, in some embodiments, voltage domains or other areas of interest may be enabled or disabled independently of clock assignments, in some embodiments. A load state, as discussed above may include load states for enabled or disabled components on an integrated circuit (e.g., enabled or disabled processor cores in a multiprocessor), in some embodiments. FIG. 6D illustrates a voltage domain 644 for which all inductors are disabled, though a "half load" state is illustrated in remaining portions of the integrated circuit. Voltage domains may include equal numbers of inductors in some embodiments whereas in other embodiments the voltage domains may not include equal numbers of inductors. In some embodiments, only some voltage domains can be independently enabled or disabled separate from phase shedding techniques.

In some embodiments, an inductor, whether magnetic core inductor or air core inductor, may be simulated for making placement decisions. For example, on-die and on-package metal surrounding the inductor could impact the inductance of the inductors and AC resistance of the inductors at the converter switching frequency. In another example, parasitic inductive coupling (PIC) effects can exacerbated by any physical conductive loops that are co-centered with the inductor core. Such PIC effects can be mitigated by increasing resistance of the surrounding metal or by breaking the loops, in some embodiments. PIC mitigation techniques may be included in some embodiments.

As discussed above with regard to FIGS. 3C and 5, distributing many inductors over a large area can complicate the design of a control loop. For instance, a large number of inductors may require generating a large number of clock phases as well as matching the duty cycles of the clock phases. In some embodiments, the number of clock phases may not be the same as the number of inductors. Instead, in such embodiments the inductors can be grouped into a smaller number of clock phases. For instance, 64 inductors can be grouped into 8 phases (i.e., 8 inductors per individual phase) as illustrated in the examples FIGS. 6A-6D. However, grouping may not ease the duty cycle matching requirement as phase mismatches between each inductor may still need to be calibrated. Mismatches within each inductor group may be averaged out, in some embodiments, in order to relax the duty cycle matching requirement.

Another consideration may be that a large number of parallel inductors distributed over a large area can degrade phase margin, in some scenarios. Parallelizing inductors can decrease the effective inductance, and may move the resonance frequency with output capacitance to a higher frequency close to the 0-dB bandwidth. Moreover, sensing points can be as far as die width or height, which could give a long control loop delay from a sensing point to a controller and back to a driver, which can further degrade phase margin. To mitigate such effects, in some embodiments, the control loop design may include the loop latency from the sense point to the driver to correctly estimate loop stability. To improve loop stability, loop bandwidth may be trimmed at the cost of transient performance, in some embodiments. Alternatively, the number of inductors may be reduced, sacrificing power conversion efficiency, in some embodiments.

Figure 8:
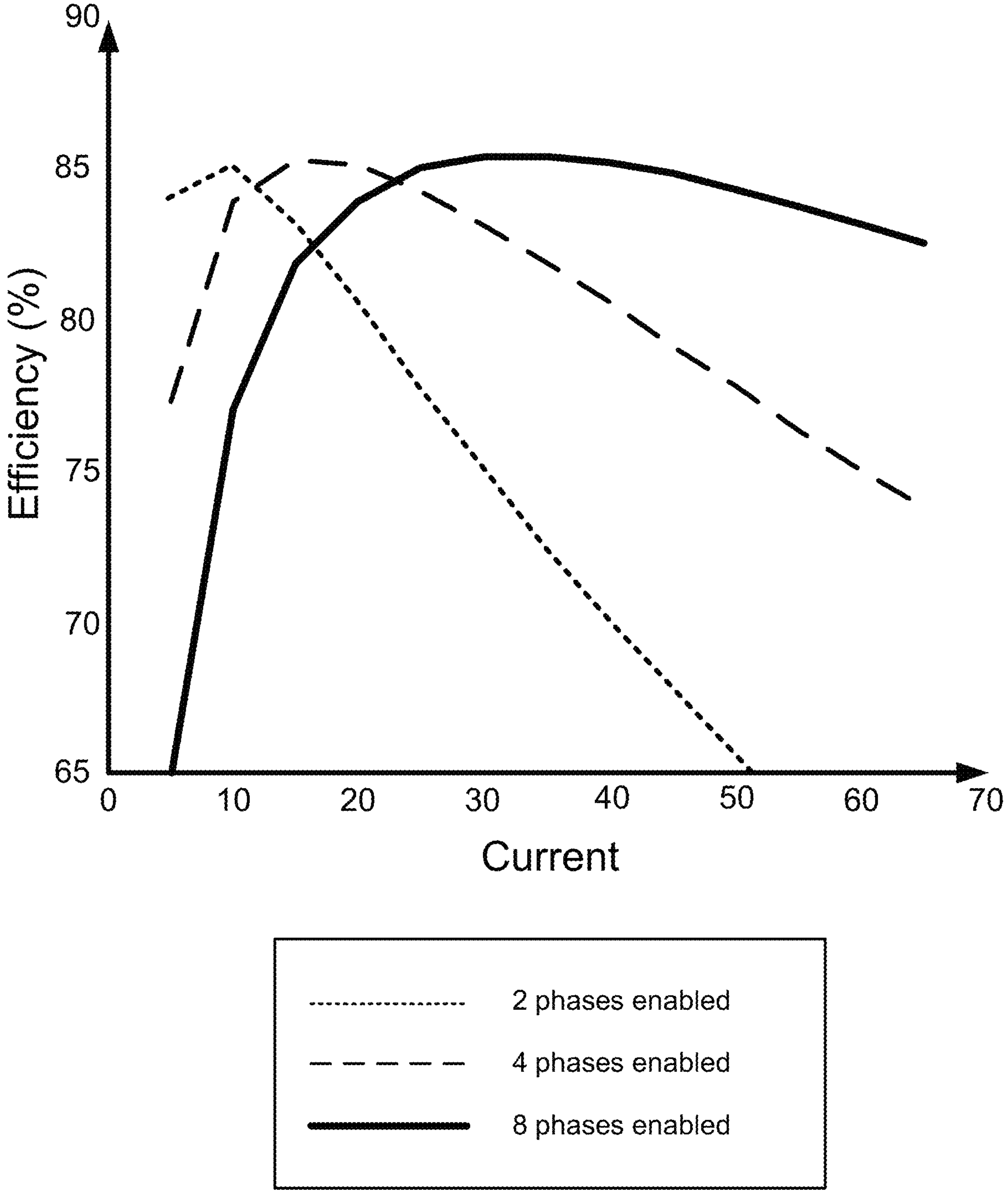
FIG. 8 is a graph of efficiency versus load states indicated by different enabled phases, according to some embodiments.

FIG. 7 illustrates an example of a circuit diagram that distributes on-chip inductors for monolithic voltage regulation, according to some embodiments. A high level goal of the example integrated circuit, designed and taped-out in a 28 nm technology, may be to demonstrate an MIVR for area and power levels representative of an Oracle SPARC® core cluster. In this example, active die area (not including the I/O ring) is 32 $mm^2$ and total inductor area is 9.6 $mm^2$. In FIG. 7, there are 8 parallel inductors per phase and 8 independent phases with the output of all the phases connected directly to the on-die PDN (via $V_{OUT}$). In the example design, four voltage sense points are averaged as indicated at 702 and fed into the compensator 704, followed by a multi-phase pulse width modulation (PWM) generator 706. Multi-phase pulse width modulation (PWM) generator 706 may produce the top side and bottom side level shifted driver gate voltages, in some embodiments. FIG. 8 shows efficiency versus current for different numbers of phases.

On-die characterization structures may be employed to verify the functionality and study the potential influence of integrated magnetics on nearby circuitry. Utility analog circuitry, such as bandgap, bias circuits, and digital logic units may be used, for instance. The example design in FIG. 7 contained two phase-locked loops (PLLs), one with an off-chip supply to drive the clock for the MIVR and one powered by the MIVR to compare performance parameters such as jitter and power supply noise rejection.

Next generation inductor technology for IVRs shows improved DC/AC resistance and advanced nodes such as 7 nm may also improve efficiency as it will be easier to work within area constraints. Furthermore, employing a custom inductor (rather than using one from a table of available inductor could further improve efficiency and place this technology in line with product-scale efficiency requirements, in some embodiments.

As power requirements of processors continue to stress the PDN at the board, package, and chip levels, MIVRs show promise as on-die inductor technologies mature. Phase distribution and floorplan can be optimized together according to the various considerations and embodiments discussed above with the traditional inductor parameters in order to get an overall efficient MIVR design, in various embodiments.

Figure 9:
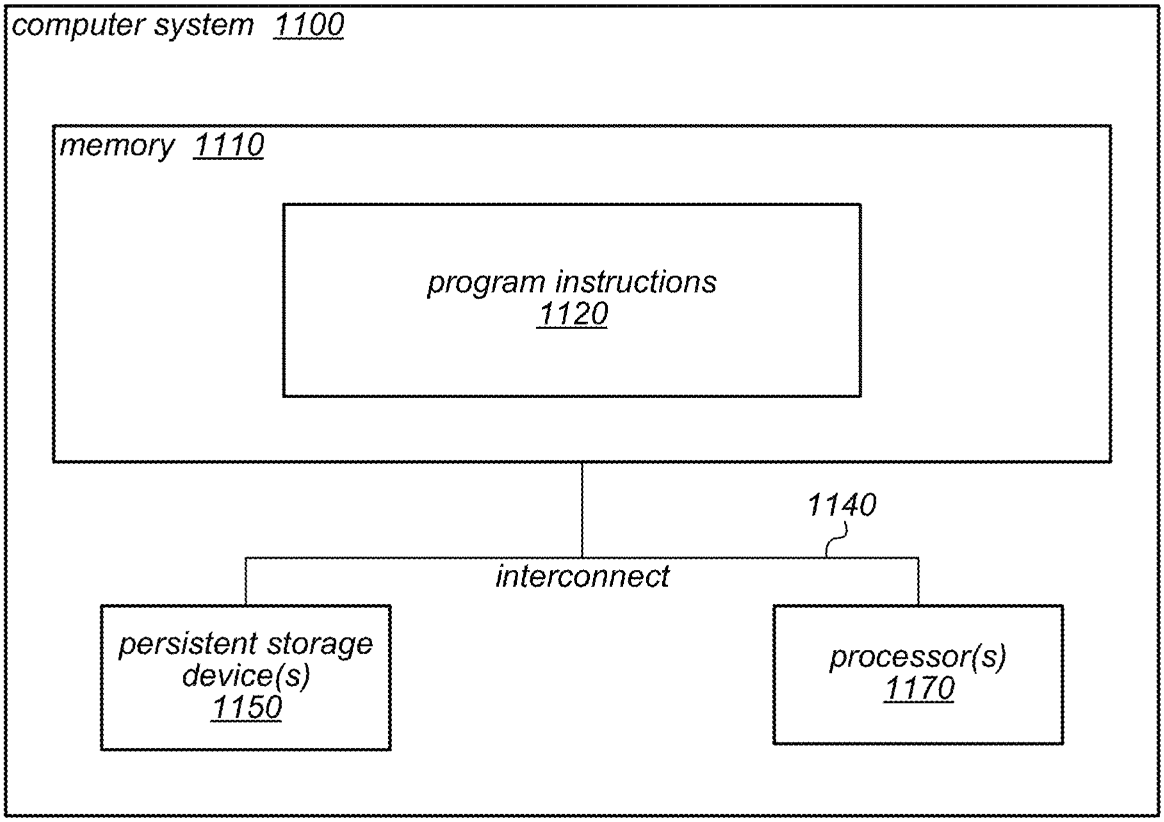
FIG. 9 illustrates an example computing system that may implement monolithically integrated voltage regulators for an integrated circuit, according to various embodiments.

FIG. 9 illustrates a computing system configured to implement the systems and methods described herein, according to various embodiments. The computer system 1100 may be any of various types of devices, including, but not limited to, a personal computer system, desktop computer, laptop or notebook computer, mainframe computer system, handheld computer, workstation, network computer, a consumer device, application server, storage device, a peripheral device such as a switch, modem, router, etc, or in general any type of computing device.

In various embodiments, computer system 1100 may include one or more processors 1170. One or more of the processors 1170 may be processors that implement monolithically integrated voltage regulators (MIVRs) as described herein. The computer system 1100 may also include one or more persistent storage devices 1150 (e.g. optical storage, magnetic storage, hard drive, tape drive, solid state memory, etc) and one or more system memories 1110 (e.g., one or more of cache, SRAM, DRAM, RDRAM, EDO RAM, DDR 10 RAM, SDRAM, Rambus RAM, EEPROM, etc.). Various embodiments may include fewer or additional components not illustrated in FIG. 6 (e.g., video cards, audio cards, additional network interfaces, peripheral devices, a network interface such as an ATM interface, an Ethernet interface, a Frame Relay interface, etc.) The one or more processors 1170, the storage device(s) 1150, and the system memory 1110 may be coupled to the system interconnect 1140. One or more of the system memories 1110 may contain program instructions 1120 executable by the one or more processors 1170.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed:

1. A processor, comprising:

an integrated voltage regulator comprising a plurality of pairs of inductors implemented on a die of the processor, wherein the pairs of inductors are not evenly distributed amongst different voltage domains, wherein a respective clock phase assigned to a first inductor of each of the pairs is different than a respective clock phase assigned to a second one of each of the pairs, and wherein the different voltage domains are enabled or disabled independently of the respective clock phases assigned to the pairs of inductors; and the pairs of inductors configured to regulate voltage as part of a power distribution network (PDN) for different respective portions of the die.

2. The processor of claim 1, wherein the respective clock phase assigned to the first inductor of each of the pairs is opposite the respective clock phase assigned to the second one of each of the pairs.

3. The processor of claim 1, wherein the respective clock phase values assigned to each of the pairs of inductors are interleaved across different ones of the pairs of inductors.

4. The processor of claim 1, wherein the processor further comprises one or more circuits configured to implement control logic for the integrated voltage regulator comprising the plurality of pairs of inductors;

wherein the control logic is configured to enable one or more of the pairs to distribute power in addition to one or more currently enabled pairs; and wherein the enabled one or more of the pairs are assigned to two or more clock phases different than two or more clock phases assigned to the one or more currently enabled pairs.

5. The processor of claim 1, wherein the processor is a multicore processor, wherein different processor cores are implemented on the die, and wherein the different voltage domains provide power to different ones of the different processor cores.

6. The processor of claim 5, wherein the processor further comprises one or more circuits configured to implement control logic for the integrated voltage regulator comprising the pairs of inductors; and wherein the control logic is configured to enable those pairs in one of the voltage domains corresponding to one of the processor cores to distribute power to the one processor core.

7. The processor of claim 5, wherein the processor further comprises one or more circuits configured to implement control logic for the integrated voltage regulator for the pairs of inductors; and wherein the control logic is configured to disable those pairs in one of the voltage domains corresponding to one of the processor cores to stop distribution of power to the one processor core.

8. The processor of claim 1, wherein a respective output port of the first inductor of each of the pairs is located on a side of the first inductor that faces a respective output port of the second one of each of the pairs.

9. An electronic assembly comprising:

a printed circuit board (PCB);

a package mounted to the PCB, the package comprising a die; and the die, comprising:

an integrated voltage regulator comprising a plurality of pairs of inductors, wherein the pairs of inductors are not evenly distributed amongst different voltage domains, wherein a respective clock phase assigned to a first inductor of each of the pairs is different than a respective clock phase assigned to a second one of each of the pairs, and wherein the different voltage domains are enabled or disabled independently of the respective clock phases assigned to the pairs of inductors; and wherein the plurality of pairs of inductors are configured to distribute power to different respective portions of the die.

10. The electronic assembly of claim 9, wherein the respective clock phase values assigned to each of the pairs of inductors are interleaved across different ones of the pairs of integrated voltage regulators.

11. The electronic assembly of claim 9, wherein the inductors of the pairs are part of a buck converter comprising magnetic core inductors.

12. The electronic assembly of claim 9, wherein the die further comprises one or more circuits configured to implement control logic for the pairs of inductors, and wherein the control logic is configured to enable one or more of the pairs to distribute power in addition to one or more currently enabled pairs.

13. The electronic assembly of claim 12, wherein the enabled one or more of the pairs are assigned to two or more clock phases different than two or more clock phases assigned to the one or more currently enabled pairs.

14. The electronic assembly of claim 9, wherein the die further comprises one or more circuits configured to implement control logic for the pairs of inductors, and wherein the control logic is configured to disable one or more of the pairs to prevent distribution of power via the one or more pairs.

15. The electronic assembly of claim 14, wherein the disablement of the one or more pairs corresponds to a shed phase.

16. The electronic assembly of claim 9, wherein the package is a central processing unit (CPU).

17. The electronic assembly of claim 9, wherein the package is a graphics processing unit (GPU).

18. A method, comprising:

detecting, by a controller for a plurality of pairs of inductors implemented on a die of processor as part of an integrated voltage regulator, a change in load on the processor, wherein the pairs of inductors are not evenly distributed amongst different voltage domains, wherein a respective clock phase assigned to a first inductor of each of the pairs is different than a respective clock phase assigned to a second one of each of the pairs and wherein the different voltage domains are enabled or disabled independently of the respective clock phases assigned to the pairs of inductors;

responsive to detecting the change in the load:

identifying, by the controller, a load state for the processor based on the detected change; and according to the identified load state:

enabling one or more of the pairs to distribute power in addition to one or more currently enabled pairs; or disabling one or more currently enabled pairs to stop distribution of power.

19. The method of claim 18, wherein the processor is a multicore processor, wherein different processor cores are implemented on the die, wherein the different voltage domains that provide power to different ones of the different processor cores, and wherein the detected change in load corresponds to enabling or disabling one of the different processor cores.

20. The method of claim 18, wherein the detected change in load corresponds to a change in a load current.

* * * * *